United States Patent
Tsuchiya

(10) Patent No.: US 10,410,824 B2
(45) Date of Patent: Sep. 10, 2019

(54) ELECTRON BEAM INSPECTION APPARATUS AND ELECTRON BEAM INSPECTION METHOD

(71) Applicant: NuFlare Technology, Inc., Yokohama-shi (JP)

(72) Inventor: Hideo Tsuchiya, Setagaya-ku (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/913,083

(22) Filed: Mar. 6, 2018

(65) Prior Publication Data
US 2018/0261424 A1 Sep. 13, 2018

(30) Foreign Application Priority Data
Mar. 10, 2017 (JP) ................................ 2017-046252

(51) Int. Cl.
*H01J 37/28* (2006.01)
*H01J 37/22* (2006.01)
*H01J 37/244* (2006.01)
*H01J 37/20* (2006.01)

(52) U.S. Cl.
CPC .......... *H01J 37/222* (2013.01); *H01J 37/244* (2013.01); *H01J 37/28* (2013.01); *H01J 37/20* (2013.01); *H01J 2237/20228* (2013.01); *H01J 2237/2448* (2013.01); *H01J 2237/2817* (2013.01)

(58) Field of Classification Search
CPC ........ H01J 37/28; H01J 37/244; H01J 37/222; H01J 2237/2817; H01J 2237/2448; H01J 2237/24475; G06T 7/001
See application file for complete search history.

(56) References Cited

U.S. PATENT DOCUMENTS

| | | | | |
|---|---|---|---|---|
| 9,728,373 B2* | 8/2017 | Kikuiri | ................. | H01J 37/045 |
| 9,898,814 B2* | 2/2018 | Kitai | ...................... | G06T 7/001 |
| 2006/0280358 A1* | 12/2006 | Ishikawa | .......... | G01N 21/95607 382/149 |
| 2007/0047799 A1* | 3/2007 | Isomura | ................... | G06K 9/00 382/147 |
| 2013/0070078 A1* | 3/2013 | Takagi | .................... | G06T 7/001 348/80 |
| 2013/0216141 A1* | 8/2013 | Ushiba | .................. | G01B 15/00 382/218 |

(Continued)

FOREIGN PATENT DOCUMENTS

JP 2007-64843 3/2007

*Primary Examiner* — Wyatt A Stoffa
(74) *Attorney, Agent, or Firm* — Oblon, McClelland, Maier & Neustadt, L.L.P.

(57) ABSTRACT

An electron beam inspection apparatus includes an analyzing circuit to input design pattern data of design pattern of a semiconductor element, and specify a position of a pattern portion including a feature point, which has previously been set, by analyzing the design pattern data; and a comparison circuit to input information on a specified position of the pattern portion including the feature point, and determine by comparing a secondary electron image and a design substrate pattern image of a region corresponding to the secondary electron image while varying a determine threshold value for the pattern portion including the feature point by using the information.

10 Claims, 11 Drawing Sheets

(56) References Cited

U.S. PATENT DOCUMENTS

| | | | | |
|---|---|---|---|---|
| 2014/0320627 A1* | 10/2014 | Miyamoto | | G03F 7/70633 |
| | | | | 348/80 |
| 2014/0348414 A1* | 11/2014 | Hashimoto | | G06T 7/001 |
| | | | | 382/144 |
| 2014/0375793 A1* | 12/2014 | Harada | | H01L 23/544 |
| | | | | 348/80 |
| 2015/0279024 A1* | 10/2015 | Tsuchiya | | G03F 1/84 |
| | | | | 382/144 |
| 2017/0069111 A1* | 3/2017 | Inoue | | G06T 7/001 |
| 2017/0125208 A1* | 5/2017 | Kikuiri | | H01J 37/045 |
| 2018/0025482 A1* | 1/2018 | Harada | | H01L 23/544 |
| | | | | 348/80 |
| 2018/0247400 A1* | 8/2018 | Toyoda | | G01N 23/225 |

* cited by examiner

ELECTRON BEAM INSPECTION APPARATUS AND ELECTRON BEAM INSPECTION METHOD

CROSS-REFERENCE TO RELATED APPLICATION

This application is based upon and claims the benefit of priority from the prior Japanese Patent Application No. 2017-046252 filed on Mar. 10, 2017 in Japan, the entire contents of which are incorporated herein by reference.

BACKGROUND OF THE INVENTION

Field of the Invention

Embodiments of the present invention relate to an electron beam inspection apparatus and an electron beam inspection method. For example, embodiments of the present invention relate to an inspection apparatus for inspecting a pattern formed on a semiconductor substrate onto which a mask pattern formed on a mask substrate has been transferred therefrom.

Description of Related Art

First, a circuit pattern layout (design pattern) of a semiconductor element (device) to be transferred (printed) onto a semiconductor substrate is generated. Then, an exposure mask (also called a reticle) on which a mask pattern for transferring the circuit pattern layout onto the semiconductor substrate has been formed is fabricated. The exposure mask is placed in a reduced projection exposure apparatus known as a stepper. The mask pattern on the exposure mask is exposed (transferred) onto an actual semiconductor substrate (wafer) by the reduced projection exposure apparatus, thereby forming a pattern on the semiconductor substrate.

With respect to the original circuit pattern layout of the semiconductor element, even if a pattern formed by just enlarging the circuit pattern layout is provided on the exposure mask so as to form a mask pattern to be exposed (transferred) onto the semiconductor substrate, the actual transferred pattern deviates from the mask pattern due to exposure conditions, influence of the proximity effect, and the like. To solve this problem, a method has been widely used where auxiliary patterns such as an OPC (Optical Proximity Correction) pattern and an SRAF (sub resolution assist features) pattern formed with a size below the resolution limit, which are in consideration of deviation in advance, are additionally arranged in a layout pattern (design pattern) to be transferred (printed) onto a semiconductor substrate so that a pattern with the auxiliary patterns may be formed on the mask substrate.

In recent years, with the advance of high integration and large capacity of large-scale integration (LSI) circuits, the line width (critical dimension) required for circuits of semiconductor elements is becoming progressively narrower. Meanwhile, since the LSI manufacturing requires a tremendous amount of manufacturing cost, it is crucial to improve its yield. Therefore, process window evaluation is performed to evaluate the margin of a mask pattern shape and that of exposure conditions in a wafer manufacturing process. Thus, wafer inspection is performed using a wafer onto which a mask pattern has actually been transferred (printed).

As an inspection method, there is known a method (die-to-database inspection method) of comparing a measured image obtained by imaging a pattern formed on a wafer with a design image obtained from design data being a basis for the measured image. According to this inspection method employed in an inspection apparatus, after performing position arrangement (alignment) between the images, they are compared in accordance with an appropriate algorithm, and if the compared images are not identical, it is determined that there is a pattern defect.

The process window evaluation described above aims to reduce critical points (hot spots) in the circuit pattern layout, to design a circuit pattern layout (design pattern) which is easy to manufacture, and to find out a process condition for easy manufacturing. For this purpose, it is necessary in the wafer inspection to check the soundness at critical points. However, since it is unknown, for the inspection apparatus side, where a critical point exists, a die-to-database inspection is performed for the whole of the inspection region surface by using a strict determine threshold value. Thus, as the die-to-database inspection is performed using the strict determine threshold value, a problem occurs in that a subtle defect is detected excessively (over precisely) in a region other than the critical point. On the other hand, according to the process window evaluation described above, critical points are searched (detected) in the wafer inspection, and the critical points are reduced by changing the design of the circuit pattern layout or changing the process conditions. Thus, it is difficult to specify a critical point in advance. Accordingly, it is required in the inspection apparatus to inhibit detecting a subtle defect excessively (over precisely) in a region other than a critical point even if there is no data specifying the critical point.

Although not relating to the wafer inspection, there is disclosed a technique for previously inputting information on a region for which an inspection threshold value is to be changed into an inspection apparatus when a mask with a mask pattern to be transferred onto a wafer is inspected (e.g., refer to Japanese Patent Application Laid-open (JP-A) No. 2007-064843). However, with this technique, since the region to change the inspection threshold value is not known for the inspection apparatus side, it is necessary to deliberately obtain from others information on the region to change the inspection threshold value.

BRIEF SUMMARY OF THE INVENTION

According to one aspect of the present invention, an electron beam inspection apparatus includes:

a storage device configured to store a design substrate pattern image generated assuming a design substrate pattern which is one among a design pattern of a semiconductor element, a design mask pattern formed on an exposure mask used for transferring the design pattern of the semiconductor element onto a semiconductor substrate, and the design substrate pattern formed on the semiconductor substrate in a case of the design mask pattern having been transferred onto the semiconductor substrate;

a secondary electron image acquisition mechanism configured to acquire a secondary electron image by secondary electrons including a reflected electron generated by irradiating the semiconductor substrate with an electron beam;

an analyzing circuit configured to input design pattern data of the design pattern of the semiconductor element, and specify a position of a pattern portion including a feature point, which has been set in advance, by analyzing the design pattern data; and a comparison circuit configured to input position information on a specified position of the pattern portion including the feature point, and determine by comparing the secondary electron image and the design substrate pattern image of a region corresponding to the secondary electron image while varying a determine threshold value for the pattern portion including the feature point by using the position information.

According to another aspect of the present invention, an electron beam inspection method includes:

storing a design substrate pattern image generated assuming a design substrate pattern which is one among a design pattern of a semiconductor element, a design mask pattern formed on an exposure mask used for transferring the design pattern of the semiconductor element onto a semiconductor substrate, and the design substrate pattern formed on the semiconductor substrate in a case of the design mask pattern having been transferred onto the semiconductor substrate;

acquiring a secondary electron image by secondary electrons including a reflected electron generated by irradiating the semiconductor substrate with an electron beam;

inputting design pattern data of the design pattern of the semiconductor element, and specifying a position of a pattern portion including a feature point, which has been set in advance, by analyzing the design pattern data; and inputting position information on a specified position of the pattern portion including the feature point, and determining by comparing the secondary electron image and the design substrate pattern image of a region corresponding to the secondary electron image while varying a determine threshold value for the pattern portion including the feature point by using the position information.

DETAILED DESCRIPTION OF THE INVENTION

The embodiments below describe an inspection apparatus and method which can inhibit, in wafer inspection, false (pseudo) defects in regions other than a critical point, based on original design pattern information in which no critical point has been specified.

Moreover, the embodiments below describe a case where, as an example of a method for capturing an image (acquiring a measured image) of a pattern formed on an inspection substrate, the inspection substrate is irradiated with multiple electron beams in order to capture a secondary electron image. However, it is not limited thereto. It is also preferable, as a method for capturing an image of a pattern formed on the inspection substrate, for example, to irradiate the inspection substrate with a single electron beam in order to capture a secondary electron image (acquire a measured image).

First Embodiment

Figure 1:
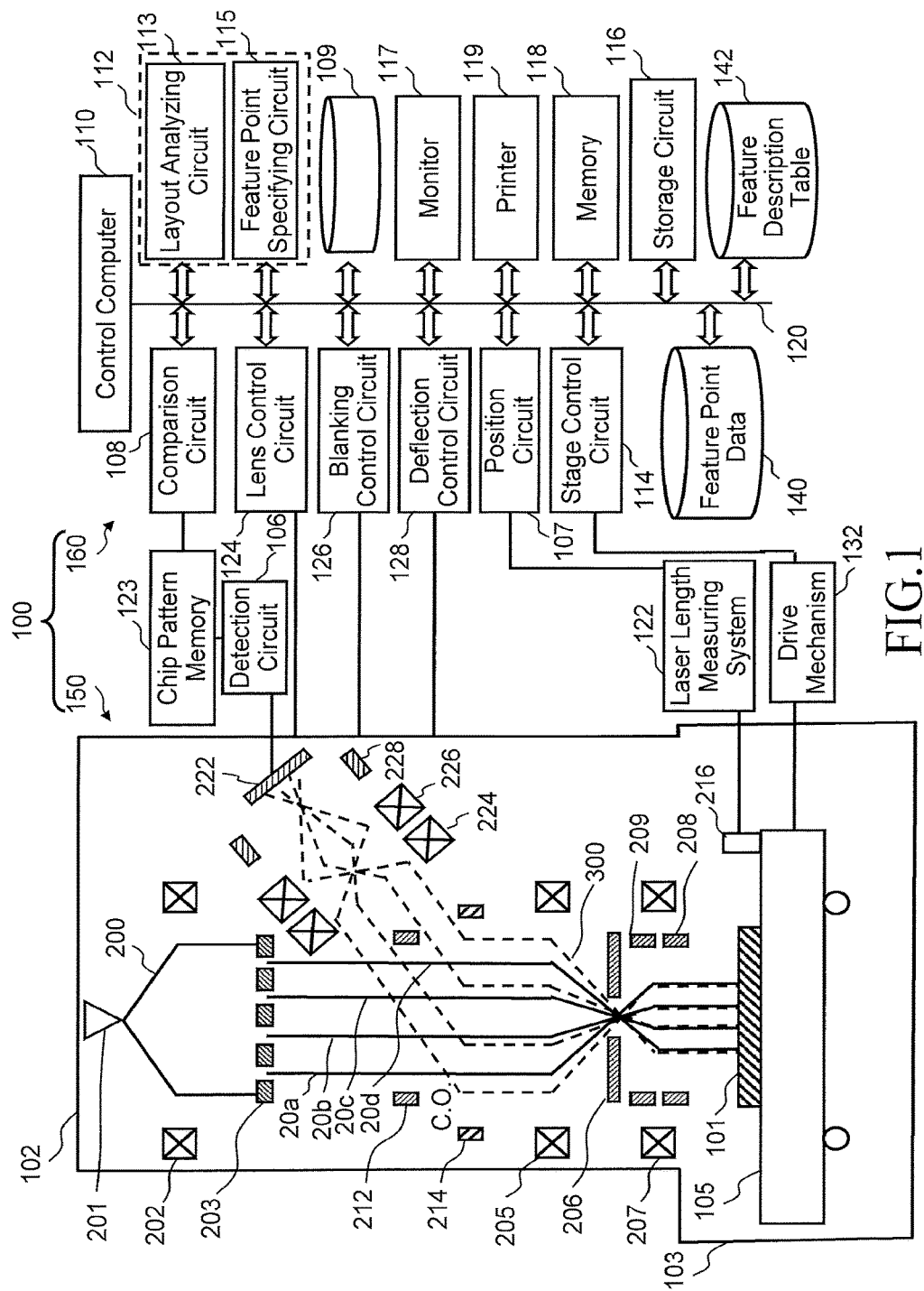
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on the substrate is an example of an electron beam inspection apparatus. The inspection apparatus 100 includes an electron optical image acquisition mechanism 150 and a control system 160. The electron optical image acquisition mechanism 150 includes an electron beam column 102 (electron optical column), an inspection chamber 103, a detection circuit 106, a chip pattern memory 123, a stage drive mechanism 132, and a laser length measurement system 122. In the electron beam column 102, there are arranged an electron gun 201, an illumination lens 202, a shaping aperture array substrate 203, a reducing lens 205, a limiting aperture substrate 206, an objective lens 207, a main deflector 208, a sub deflector 209, a common blanking deflector 212, a beam separator 214, projection lenses 224 and 226, a deflector 228, and a multi-detector 222.

In the inspection chamber 103, there is arranged an XY stage 105 which is movable at least in the x-y plane. On the XY stage 105, there is placed a substrate 101 on which a plurality of chip patterns (wafer die) to be inspected have been formed. The substrate 101 may be a semiconductor substrate such as a silicon wafer. The substrate 101 is placed, on the XY stage 105, with its pattern forming surface facing upward, for example. Moreover, on the XY stage 105, there is arranged a mirror 216 which reflects a laser beam for measuring a laser length emitted from the laser length measurement system 122 arranged outside the inspection chamber 103. The multi-detector 222 is connected, at the outside of the electron beam column 102, to the detection circuit 106. The detection circuit 106 is connected to the chip pattern memory 123.

In the control system 160, a control computer 110 which controls the entire apparatus is connected, through a bus 120, to a position circuit 107, a comparison circuit 108, a critical point candidate analyzing/specifying circuit 112, a stage control circuit 114, a storage circuit 116, a lens control circuit 124, a blanking control circuit 126, a deflection control circuit 128, storage devices 109, 140, and 142, such as magnetic disk drives, a monitor 117, a memory 118, and a printer 119. In the critical point candidate analyzing/ specifying circuit 112, there are arranged a layout analyzing circuit 113 and a feature point specifying circuit 115.

The chip pattern memory 123 is connected to the comparison circuit 108. The XY stage 105 is driven by a drive mechanism 132 under the control of the stage control circuit 114. In the drive mechanism 132, the XY stage 105 can be moved by a drive system, such as a three-axis (X, Y, and θ) motor, which drives the stage in the directions of x, y, and θ. For example, a step motor can be used as each of these X, Y, and θ motors (not shown). The XY stage 105 is movable in the horizontal direction and the rotation direction by the motors of the X-axis, Y-axis, and θ-axis. The movement position of the XY stage 105 is measured by the laser length measurement system 122, and supplied (transmitted) to the position circuit 107. The laser length measurement system 122 measures the position of the XY stage 105 by receiving a reflected light from the mirror 216, based on the principle of laser interferometry.

To the electron gun 201, there is connected a high voltage power supply circuit (not shown). The high voltage power supply circuit applies an acceleration voltage between a filament and an extraction electrode (anode) (which are not shown) in the electron gun 201. In addition to applying the acceleration voltage as described above, by applying a voltage to a predetermined extraction electrode (Wehnelt) and heating a cathode at a predetermined temperature, electrons emitted from the cathode are accelerated and emitted as an electron beam 200. For example, electromagnetic lenses are used as the illumination lens 202, the reducing lens 205, the objective lens 207, and the projection lenses 224 and 226, and all of them are controlled by the lens control circuit 124. The beam separator 214 is also controlled by the lens control circuit 124. Each of the common blanking deflector 212 and the deflector 228 is configured by at least two electrodes, and controlled by the blanking control circuit 126. Each of the main deflector 208 and the sub deflector 209 is configured by at least four electrodes, and controlled by the deflection control circuit 128.

FIG. 1 shows configuration elements necessary for describing the first embodiment. It should be understood that other configuration elements generally necessary for the inspection apparatus 100 may also be included therein.

Figure 2:
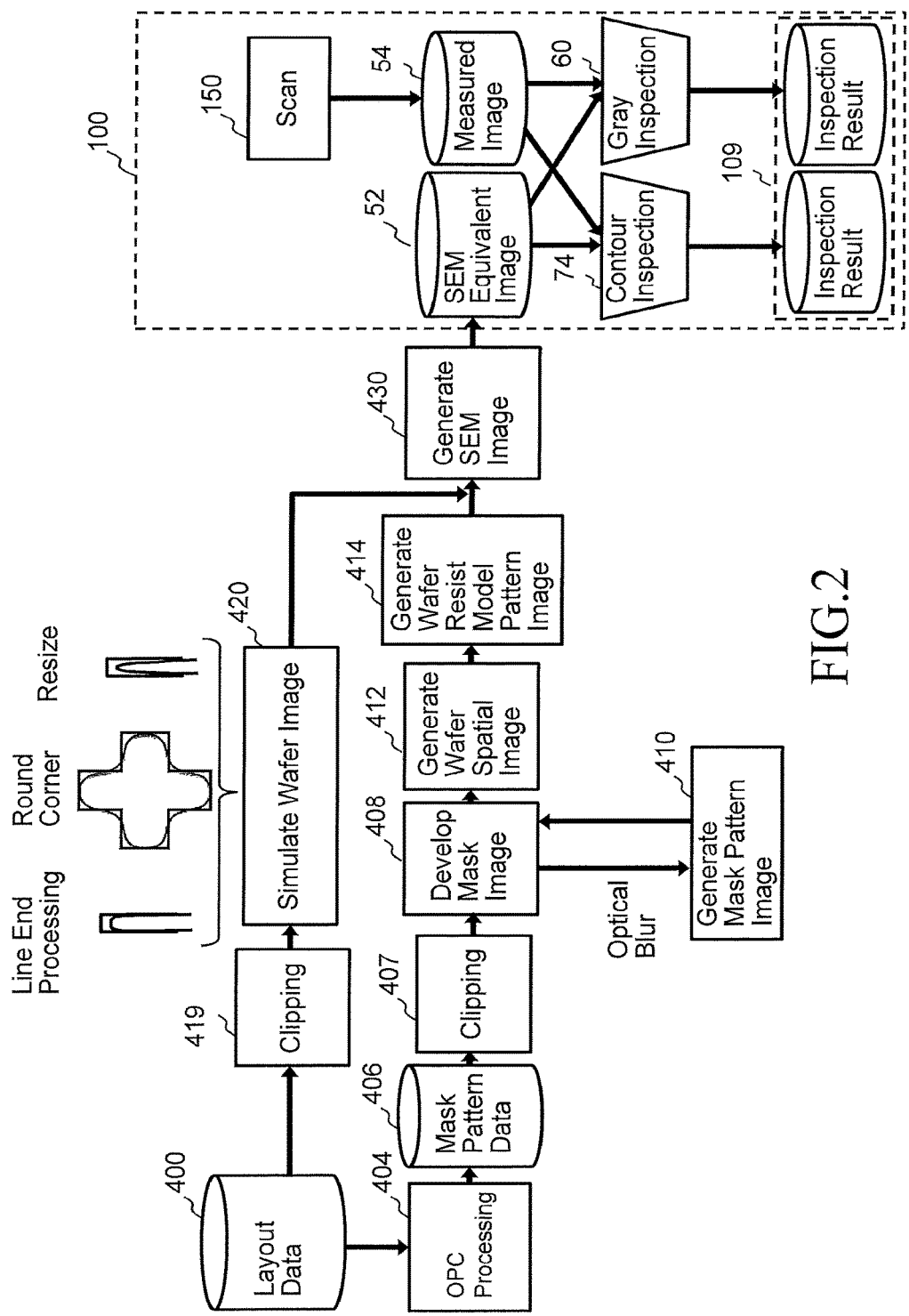
FIG. 2 shows an example of a generation flow of a wafer reference image according to the first embodiment.

FIG. 2 shows an example of a generation flow of a wafer reference image according to the first embodiment. In FIG. 2, first, a circuit pattern layout (design pattern of a semiconductor element) to be formed on the wafer is designed by the designer, and layout data (design pattern data) of the circuit pattern layout is generated. The generated layout data is stored in a storage device 400.

For generating, by using the layout data, an image equivalent to a wafer pattern image to be actually transferred onto the wafer by the exposure apparatus, there exist two methods: one is to generate images sequentially based on an actual semiconductor manufacturing process, and the other is to simply generate images at a time by simulation. First of all, the method of generating images sequentially based on an actual semiconductor manufacturing process is described below.

An auxiliary pattern processing device 404 (OPC processing unit) generates design mask pattern data by additionally arranging an auxiliary pattern, such as an OPC (Optical Proximity Correction) pattern and an SRAF (sub resolution assist features) pattern formed with a size below the resolution limit, which are in consideration of deviation in advance, in design pattern data. The generated design mask pattern data (writing data) is stored in the storage device 406. The design mask pattern data is input into an electron beam writing apparatus (not shown) so that a necessary mask pattern may be written on the exposure mask substrate.

Next, as clipping processing, a clipping processing device 407 reads design mask pattern data, and assigns corresponding figure patterns in the circuit pattern to each of a plurality of stripe regions obtained by dividing the pattern formation region of the mask surface into strip-shaped regions. Then, a mask image development device 408 develops an image of the design mask pattern data so as to generate a reference design mask pattern image (image of a design mask pattern). A pattern obtained as this reference design mask pattern image corresponds to a design mask pattern formed on the exposure mask used for transferring a design pattern of a semiconductor element onto a semiconductor substrate. However, if capturing an image of a mask pattern actually formed on the mask substrate, since it is in a state affected by the filtering due to resolution characteristics of the optical system, the aperture effect of an imaging sensor, etc., in other words, it is in an analog state continuously changing, it differs from a reference mask pattern image being image data of the design side whose image intensity (gray value) is represented by digital values.

Therefore, a mask pattern image generation apparatus 410 applies filtering to a reference design mask pattern image being image data, represented by digital values, on the design side in order to match/fit it with a mask pattern image. In mask inspection, usually, a design mask pattern image to which such filtering has been applied is used as a reference image. However, according to the first embodiment, since inspection of a wafer pattern is performed, the design mask pattern image cannot be used as a reference image.

Next, a wafer spatial image generation apparatus 412 generates a spatial image of the mask pattern concerned based on illumination conditions and focus conditions of the mask in the case of a pattern obtained as a reference design mask pattern image being exposed onto a semiconductor substrate (wafer) by exposure apparatus.

Next, a wafer resist model pattern image generation apparatus 414 generates, using a resist pattern onto which the generated spatial image of the mask concerned has been transferred, an image of a reference design wafer pattern to be formed on the semiconductor substrate (wafer) by etching, etc.

As described above, a reference design wafer pattern image is generated by generating images sequentially in accordance with an actual semiconductor manufacturing process.

Alternatively, as clipping processing, a clipping processing device 419 reads the design pattern data, and assigns corresponding figure patterns in the circuit pattern to each of a plurality of stripe regions obtained by dividing the pattern formation region of the mask surface into strip-shaped regions. Then, it is also preferable that a wafer image simulation apparatus 420 generates, with respect to a pattern defined in the design pattern data after clipping processing, a reference design wafer pattern image by reducing operational processing, shortening a line end, rounding a rectangular corner, and resizing processing, all at once, on the assumption of a wafer image by simulation.

However, in wafer inspection, since the inspection is performed using a secondary electron image generated by irradiation of an electron beam, it is necessary to make an image be in accordance with resolution characteristics of an electron optical system generated when acquiring a secondary electron image. Then, an SEM image generation apparatus 430 generates a design wafer pattern image by performing, for a reference design wafer pattern image, filtering processing in accordance with the resolution characteristics of the electron optical system. The design wafer pattern image (SEM equivalent image) is equivalent to a design substrate pattern image generated on the assumption of a design substrate pattern in the case where a design mask pattern is transferred to a semiconductor substrate (wafer) to be formed thereon. The generated design wafer pattern image (SEM equivalent image) is output to the inspection apparatus 100, and stored in the storage device 109 therein. According to the first embodiment, the design wafer pattern image (SEM equivalent image) is used as a reference image in the wafer inspection.

Figures 3A, 3B, 3C:
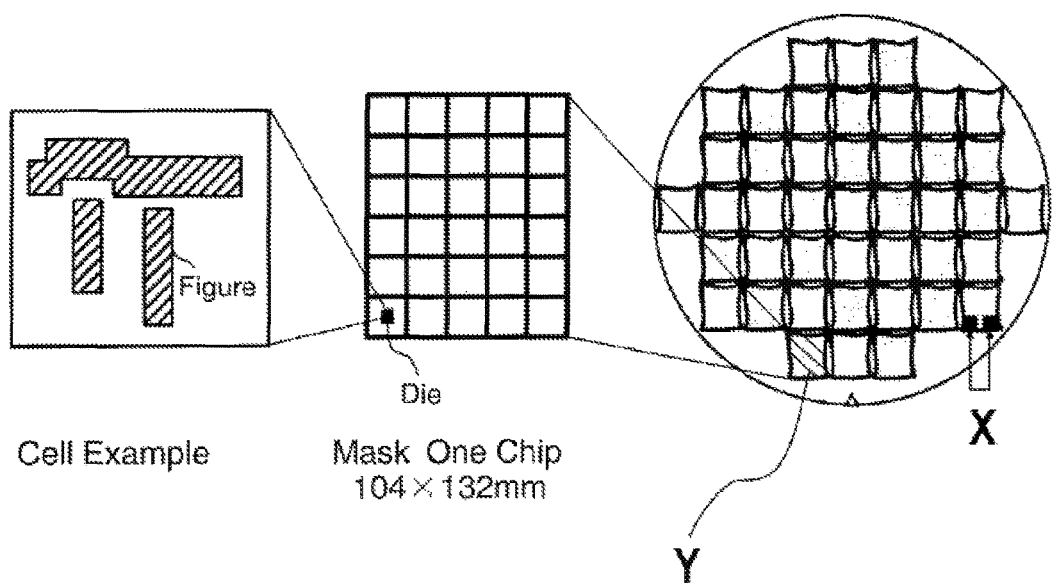
FIGS. 3A to 3C individually illustrate each region according to the first embodiment.

FIGS. 3A to 3C individually illustrate each region according to the first embodiment. As shown in FIG. 3B, usually, a pattern for one chip is formed on the exposure mask. A plurality of dies (mask die) are arranged in one chip. As shown in FIG. 3A, a plurality of cell patterns are formed in each die (mask die). A cell pattern configures a circuit for one logical element, or a circuit for one bit of a memory, for example. A mask pattern for one chip, formed on the exposure mask, is repeatedly reduced and projected onto the wafer. As a result, as shown in FIG. 3C, a plurality of chip patterns each of which is the same pattern are formed two-dimensionally on the wafer. Each formed chip is clipped from the wafer by dicing, and the clipped one chip is called a die (wafer die). In the wafer inspection according to the first embodiment, not a wafer die but a mask die is used as an inspection region unit. As illustrated by X, a die comparison of the wafer indicates a comparison with respect to one chip. As illustrated by Y, wafer one die corresponds to mask one chip. 26×33 mm. Hereinafter, wafer inspection using the inspection apparatus 100 will be described below.

In the secondary electron image acquisition step, the electron optical image acquisition mechanism 150 (secondary electron image acquisition mechanism) acquires a secondary electron image by secondary electrons including a reflected electron generated by irradiating the semiconductor substrate (wafer) 101 with an electron beam.

Figure 4:
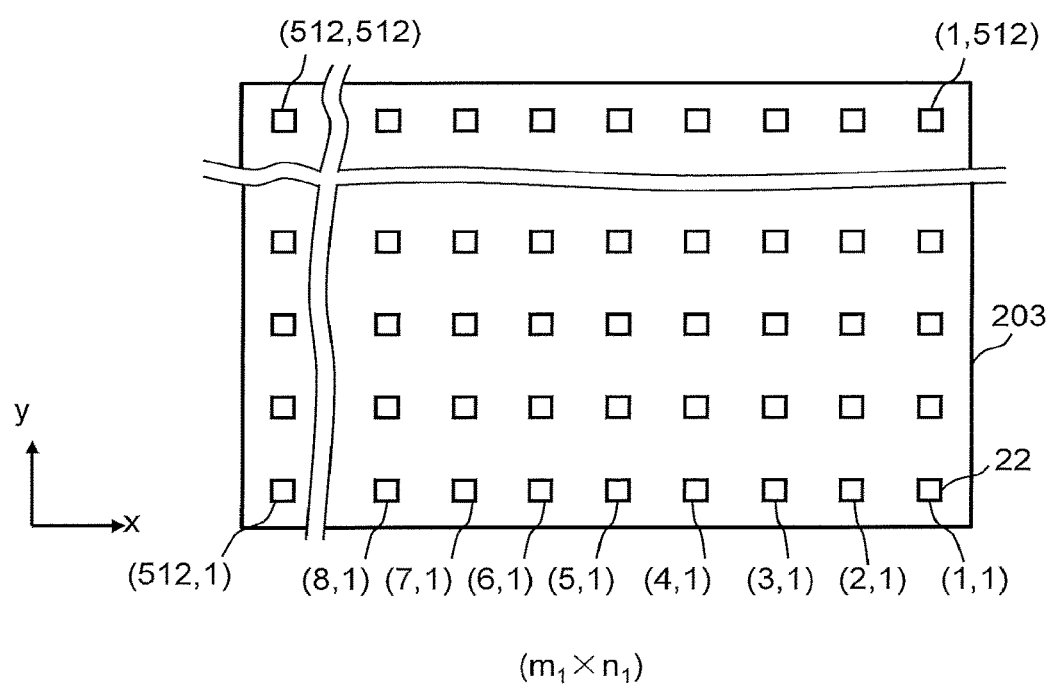
FIG. 4 is a conceptual diagram showing a structure of a shaping aperture array substrate according to the first embodiment.

FIG. 4 is a conceptual diagram showing a structure of a shaping aperture array substrate according to the first embodiment. As shown in FIG. 4, holes (openings) 22 of $m_1$ columns wide (width in the x direction) and $n_1$ rows long (length in the y direction) (each of $m_1$ and $n_1$ is an integer of 2 or more) are two-dimensionally formed at a predetermined arrangement pitch in the shaping aperture array substrate 203. In FIG. 4, for example, holes 22 of 512 (columns arrayed in x direction)×512 (rows arrayed in y direction) are formed. Each of the holes 22 is a quadrangle (rectangle) having the same dimension and shape. Alternatively, each of the holes 22 may be a circle with the same outer diameter. Multi-beams 20 are formed by making portions of the electron beam 200 individually pass through a corresponding one of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 4 where holes are arranged like a grid in the width and length directions. For example, with respect to the k-th and the (k+1)th rows arrayed in the length direction (y direction), each hole in the k-th row and each hole in the (k+1)th row may be mutually displaced in the width direction (x direction) by a dimension "a". Similarly, with respect to the (k+1)th and the (k+2)th rows arrayed in the length direction (y direction), each hole in the (k+1)th row and each hole in the (k+2)th row may be mutually displaced in the width direction (x direction) by a dimension "b". Now, operations of the electron optical image acquisition unit 150 in the inspection apparatus 100 will be described.

The electron beam 200 emitted from the electron gun 201 (emission source) almost perpendicularly (vertically) illuminates the whole of the shaping aperture array substrate 203 by the illumination lens 202. As shown in FIG. 4, a plurality of quadrangular (rectangular) holes 22 (openings) are formed in the shaping aperture array substrate 203. The region including all the plurality of holes 22 is irradiated by the electron beam 200. For example, a plurality of quadrangular electron beams (multi-beams) (a plurality of first electron beams) 20a to 20d (solid lines in FIG. 1) are formed by making portions of the electron beam 200, which irradiate the positions of a plurality of holes 22, individually pass through a corresponding one of the plurality of holes 22 in the shaping aperture array substrate 203.

Then, the multi-beams 20a to 20d form a crossover (C.O.). After having passed through the beam separator 214 arranged at the crossover position of the multi-beams 20, the multi-beams 20a to 20d are reduced by the reducing lens 205, and go toward the hole in the center of the limiting aperture substrate 206. At this stage, when being collectively deflected by the common blanking deflector 212 placed between the shaping aperture array substrate 203 and the reducing lens 205, the entire multi-beams 20a to 20d deviate from the hole in the center of the limiting aperture substrate 206 so as to be blocked by the limiting aperture substrate 206. On the other hand, the multi-beams 20a to 20d which were not deflected by the common blanking deflector 212 pass through the hole in the center of the limiting aperture substrate 206 as shown in FIG. 1. Blanking control is provided by ON/OFF of the common blanking deflector 212 to collectively control ON/OFF of the beams. Thus, the limiting aperture substrate 206 blocks the multi-beams 20a to 20d which were deflected to be in the OFF condition by the common blanking deflector 212. Then, the multi-beams 20a to 20d for inspection are formed by the beams having been made during a period from becoming "beam ON" to becoming "beam OFF" and having passed through the limiting aperture substrate 206. The multi-beams 20a to 20d having passed through the limiting aperture substrate 206 are focused by the objective lens 207 to be a pattern image (beam diameter) of a desired reduction ratio. Then, the whole of the multi-beams 20 having passed through the limiting aperture substrate 206 are collectively deflected in the same direction by the main deflector 208 and the sub deflector 209 in order to irradiate respective beam irradiation positions on the substrate 101. In such a case, the main deflector 208 collectively deflects the entire multi-beams 20 to a reference position of the mask die to be scanned by the multi-beams 20. In the case of performing scanning while continuously moving the XY stage 105, tracking deflection is further performed to follow the movement of the XY stage 105. Then, the sub deflector 209 collectively deflects the entire multi-beams 20 so that each beam may scan a corresponding region. Ideally, the multi-beams 20 irradiating at a time are aligned at the pitch obtained by multiplying the arrangement pitch of a plurality of holes 22 in the shaping aperture array substrate 203 by a desired reduction ratio (1/a) described above. Thus, the electron beam column 102 irradiates the substrate 101 with two-dimensional $m_1 \times n_1$ multi-beams 20 at a time. A flux of secondary electrons (multi-secondary electrons 300) (dotted lines in FIG. 1) including reflected electrons, corresponding to each beam of the multi-beams 20, is emitted from the substrate 101 due to irradiation of the multi-beams 20 at desired positions on the substrate 101.

The multi-secondary electrons 300 emitted from the substrate 101 are refracted to their central side by the objective lens 207, and advance toward the hole in the center of the limiting aperture substrate 206. The multi-secondary electrons 300 having passed through the limiting aperture substrate 206 are refracted almost parallel to the optical axis by the reducing lens 205, and advance to the beam separator 214.

The beam separator 214 generates an electric field and a magnetic field to be orthogonal to each other in the plane perpendicular to the traveling direction (optical axis) of the multi-beam 20. The electric field exerts a force in a fixed direction regardless of the traveling direction of electrons. In contrast, the magnetic field exerts a force in accordance with Fleming's left-hand rule. Therefore, the direction of force acting on electrons can be changed depending on an entering direction of an electron. With respect to the multi-beams 20 (primary electron beam) entering the beam separator 214 from the upper side, since the force due to the electric field and the force due to the magnetic field cancel each other, the multi-beams 20 go straight downward. On the other hand, with respect to the multi-secondary electrons 300 entering the beam separator 214 from the lower side, since both the force due to the electric field and the force due to the magnetic field are exerted in the same direction, the multi-secondary electrons 300 are bent obliquely upward.

The multi-secondary electrons 300 bent obliquely upward are projected onto the multi-detector 222, while being refracted by the projection lenses 224 and 226. The multi-detector 222 detects the projected multi-secondary electrons 300. The multi-detector 222 includes a diode type two-dimensional sensor (not shown). Then, at the position of the diode type two-dimensional sensor corresponding to each beam of the multi-beams 20, each secondary electron of the multi-secondary electrons 300 collides with the diode type two-dimensional sensor so as to generate an electron. Then, secondary electron image data is generated for each pixel to be described later. When the multi-detector 222 does not detect the multi-secondary electrons 300, it is sufficient to make the multi-secondary electrons 300 not reach the light receiving surface by performing blanking deflection of the multi-secondary electrons 300 by the deflector 228.

Figure 5:
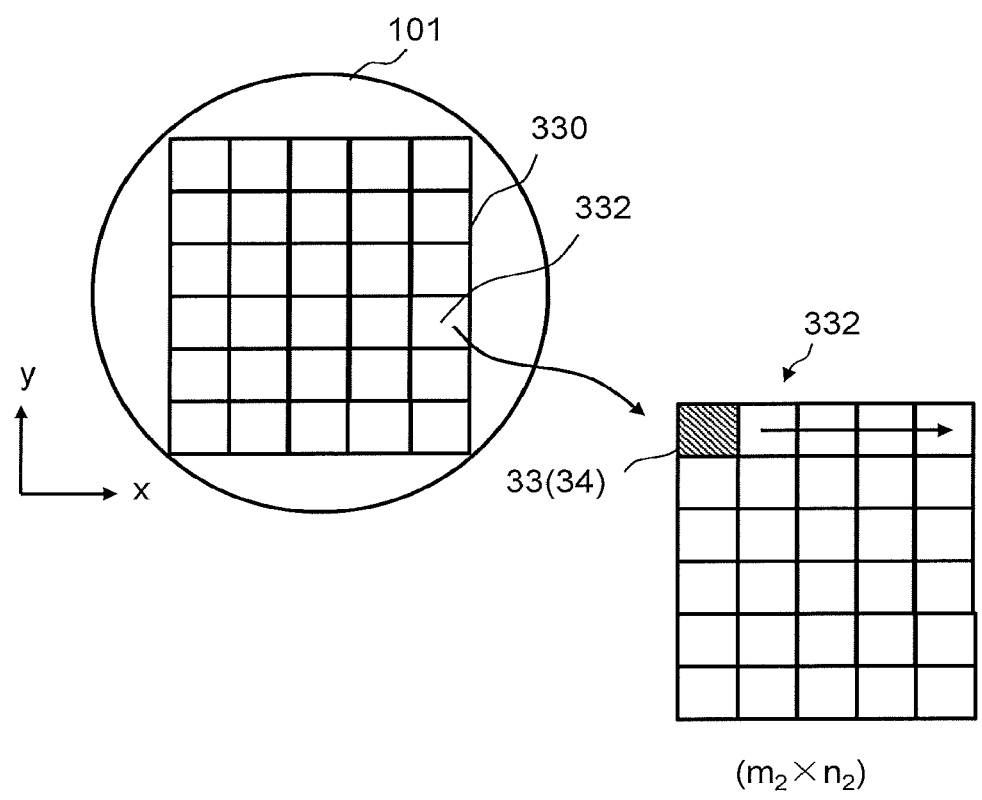
FIG. 5 shows an example of a plurality of chip regions formed on a semiconductor substrate according to the first embodiment.

FIG. 5 shows an example of a plurality of chip regions formed on a semiconductor substrate according to the first embodiment. In FIG. 5, a plurality of chips (wafer die) 332 in a two-dimensional array are formed in an inspection region 330 of the semiconductor substrate 101. A mask pattern for one chip formed on the mask substrate described above has been reduced to ¼, for example, and transferred onto each chip 332 by an exposure device (stepper) (not shown). The inside of each chip 332 is divided into a plurality of mask dies 33 of $m_2$ columns wide (width in the x direction) and $n_2$ rows long (length in the y direction) (each of $m_2$ and $n_2$ is an integer of 2 or more), for example. According to the first embodiment, the mask die 33 serves as a unit inspection region.

Figure 6:
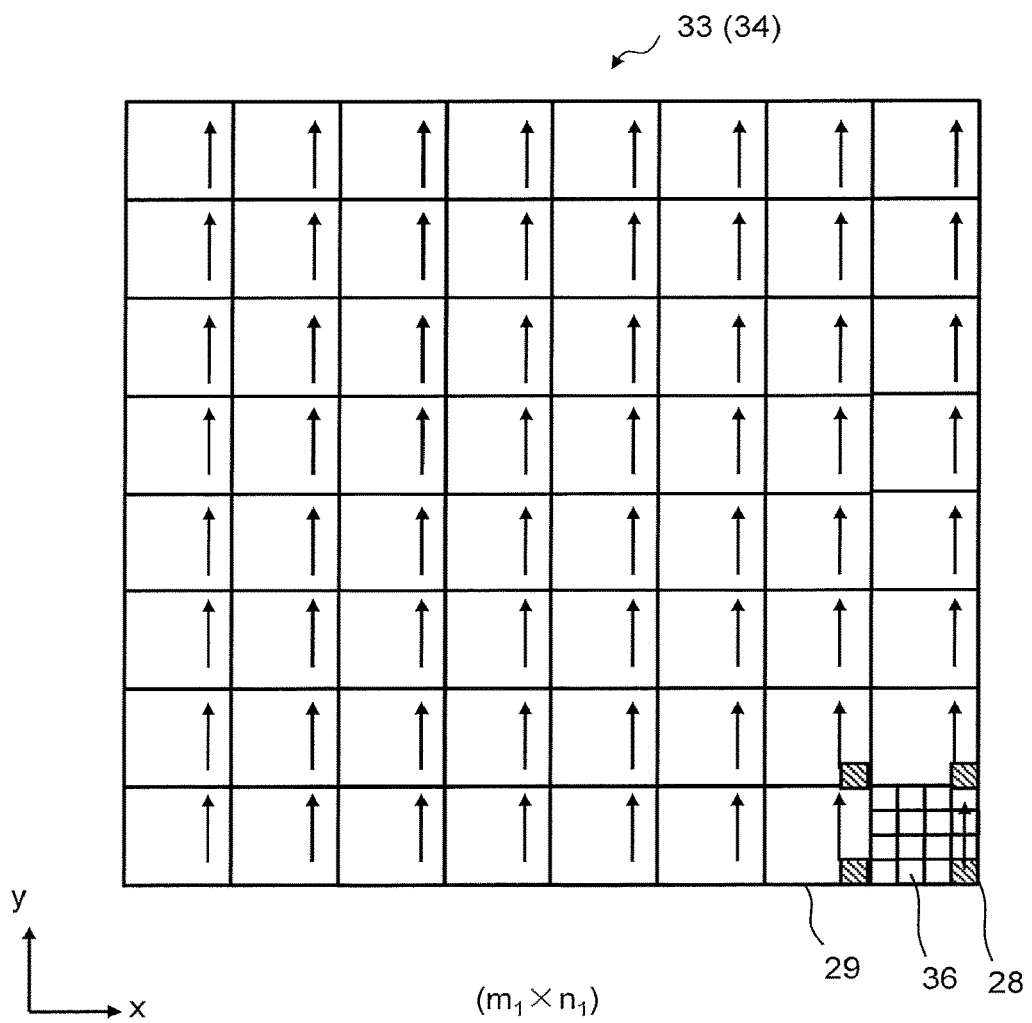
FIG. 6 shows an example of an irradiation region of multi-beams and a measurement pixel according to the first embodiment.

FIG. 6 shows an example of an irradiation region of multi-beams and a measurement pixel according to the first embodiment. In FIG. 6, each mask die 33 is divided into a plurality of mesh regions, for example, by the size of each beam of multi-beams. Each mesh region serves as a measurement pixel 36 (unit irradiation region). FIG. 6 shows the case of multi-beams of 8×8 (rows by columns). The size of the irradiation region 34 that can be irradiated with one irradiation of the multi-beams 20 is defined by (x direction size obtained by multiplying pitch between beams in x direction of the multi-beams 20 by the number of beams in the x direction)×(y direction size obtained by multiplying pitch between beams in y direction of the multi-beams 20 by the number of beams in the y direction). In the case of FIG. 6, the irradiation region 34 and the mask die 33 are of the same size. However, it is not limited thereto. The irradiation region 34 may be smaller than the mask die 33, or larger than it. In the irradiation region 34, there are shown a plurality of measurement pixels 28 (irradiation positions of beams of one shot) which can be irradiated with one irradiation of the multi-beams 20. In other words, the pitch between adjacent measurement pixels 28 serves as the pitch between beams of the multi-beams. In the example of FIG. 6, one sub-irradiation region 29 is a square region surrounded at four corners by four adjacent measurement pixels 28, and including one of the four measurement pixels 28. In the example of FIG. 6, each sub-irradiation region 29 is composed of 4×4 pixels 36.

A scanning operation according to the first embodiment is performed for each mask die 33. FIG. 6 shows an example of scanning of one certain mask die 33. When all of the multi-beams 20 are used, there are arranged $m_1 \times n_1$ sub irradiation regions 29 in the x and y directions (two-dimensionally) in one irradiation region 34. The XY stage 105 is moved to a position where the first mask die 33 can be irradiated with the multi-beams 20. The main deflector 208 collectively deflects the entire multi-beams 20 to a reference position of the mask die 33 to be scanned by the multi-beams 20. The XY stage 105 is stopped at that position, and then, regarding the mask die 33 concerned as the irradiation region 34, the inside of the mask die 33 concerned is scanned. When scanning while continuously moving the XY stage 105, the main deflector 208 performs tracking deflection such that it further follows the movement of the XY stage 105. Each beam of the multi-beams 20 takes charge of any one of the sub irradiation regions 29 which are different from each other. At the time of each shot, each beam irradiates one measurement pixel 28 corresponding to the same position in the sub-irradiation region 29 concerned. In the case of FIG. 6, the sub deflector 209 performs deflection such that the first shot of each beam irradiates the first measurement pixel 36 from the right in the bottom row in the sub-irradiation region 29 concerned. Thus, irradiation of the first shot is performed. Then, the beam deflection position is shifted in the y direction by the amount of one measurement pixel 36 by collectively deflecting the entire multi-beams 20 by the sub deflector 209, and the second shot irradiates the first measurement pixel 36 from the right in the second row from the bottom in the sub-irradiation region 29 concerned. Similarly, the third shot irradiates the first measurement pixel 36 from the right in the third row from the bottom in the sub-irradiation region 29 concerned. The fourth shot irradiates the first measurement pixel 36 from the right in the fourth row from the bottom in the sub-irradiation region 29 concerned. Next, the beam deflection position is shifted to the second measurement pixel 36 from the right in the bottom row by collectively deflecting the entire multi-beams 20 by the sub deflector 209. Similarly, the measurement pixels 36 are irradiated in order in the y directions. By repeating this operation, all the measurement pixels 36 in one sub-irradiation region 29 are irradiated in order with one beam. With respect to one shot, the secondary electrons 300 corresponding to a plurality of shots whose maximum number is the same as the number of a plurality of holes 22 are detected at a time by the multi-beams formed by passing through the plurality of holes 22 in the shaping aperture array substrate 203.

As described above, the entire multi-beams 20 scans the mask die 33 as the irradiation region 34, and that is, each beam individually scans one corresponding sub-irradiation region 29. After scanning one mask die 33 is completed, the irradiation region 34 is moved to a next adjacent mask die 33 in order to scan the next adjacent mask die 33. This operation is repeated to proceed scanning of each chip 332. Due to shots of the multi-beams 20, the secondary electrons 300 are emitted from the irradiated measurement pixels 36 at each time of the shot so as to be detected by the detector 222. According to the first embodiment, the detector 222 detects the secondary electron 300 emitted upward from each measurement pixel 36, for each measurement pixel 36 (or each sub-irradiation region 29) as a unit detection region size.

By performing scanning using the multi-beams 20 as described above, the scanning operation (measurement) can be performed at a higher speed than scanning by a single beam. The scanning of each mask die 33 may be performed by the "step and repeat" operation, alternatively it may be performed by continuously moving the XY stage 105. When the irradiation region 34 is smaller than the mask die 33, the scanning operation may be performed moving the irradiation region 34 in the mask die 33 concerned.

As described above, using the multi-beams 20, the electron optical image acquisition mechanism 150 scans the substrate 101 to be inspected, on which a figure pattern is formed, and detects the multi-secondary electrons 300 emitted from the inspection substrate 101 due to irradiation of the multi-beams 20 on the inspection substrate 101. Detected data on secondary electrons (secondary electron image) from each measurement pixel 36 detected by the multi-detector 222 is output to the detection circuit 106 in order of measurement. In the detection circuit 106, the detected data in analog form is converted into digital data by an A-D converter (not shown), and stored in the chip pattern memory 123. Then, when the detected data for one chip 332 has been accumulated, the accumulated data is transmitted as chip pattern data to the comparison circuit 108, transmitted with information on each position from the position circuit 107.

Figure 7:
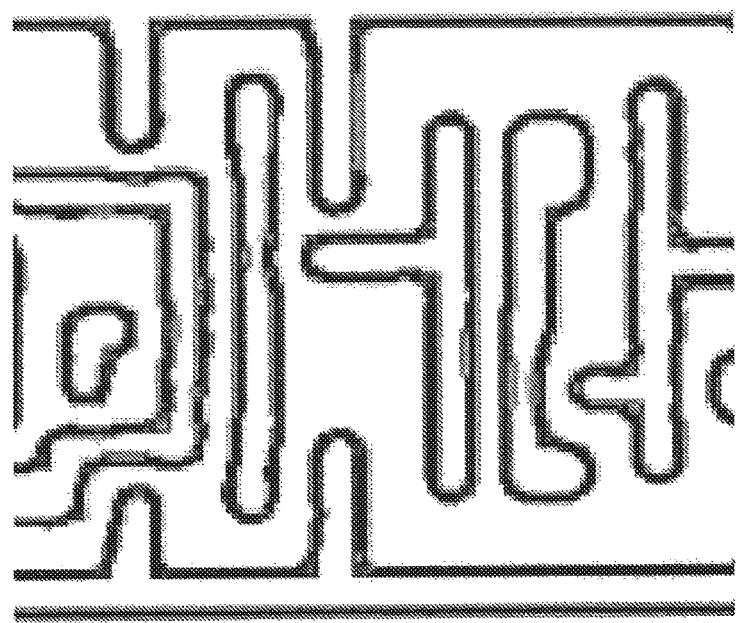
FIG. 7 shows an example of a proper wafer pattern having been transferred (printed) based on a suitable mask pattern and suitable exposure conditions described in the first embodiment.

FIG. 7 shows an example of a proper wafer pattern having been transferred (printed) based on a suitable mask pattern and suitable exposure conditions described in the first embodiment. As shown in FIG. 7, when transferred (printed) based on the suitable mask pattern and the suitable exposure conditions, the wafer pattern can be formed without generating a pattern bridge or a pattern neck where circuits are in contact with each other.

Figure 8:
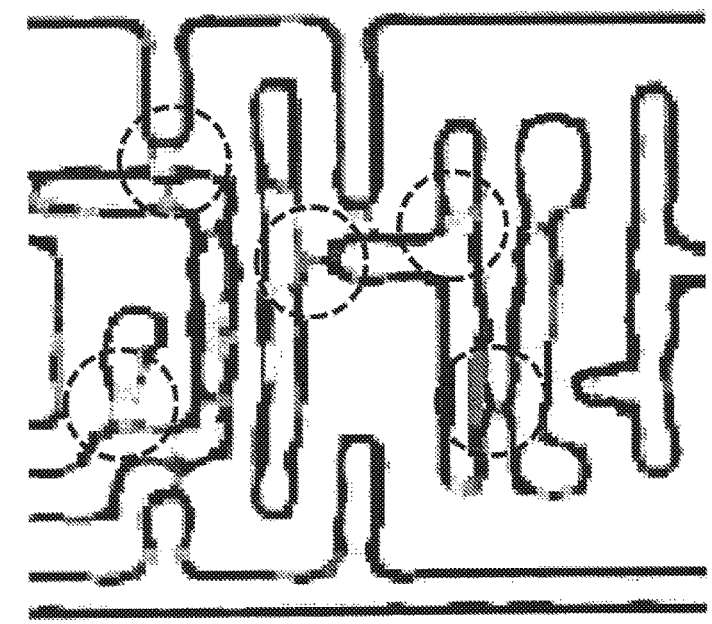
FIG. 8 shows an example of a wafer pattern having been transferred (printed) based on a mask pattern in which an unsuitable assistant pattern is arranged or based on unsuitable exposure conditions described in the first embodiment.

FIG. 8 shows an example of a wafer pattern having been transferred (printed) based on a mask pattern in which an unsuitable assistant pattern is arranged or based on unsuitable exposure conditions described in the first embodiment. As shown in FIG. 8, a pattern bridge or pattern neck has been generated in the portions surrounded by the dotted lines. The wafer pattern is based on a mask whose OPC or assistant pattern is unsuitable or on unsuitable exposure conditions, such as focus, dose, etc. The process window evaluation aims to reduce critical points (hot spots) in the circuit pattern layout, such as the portion surrounded by the dotted line, to design a circuit pattern layout (design pattern) which is easy to manufacture, and to find out a process condition for easy manufacturing.

Figure 9:
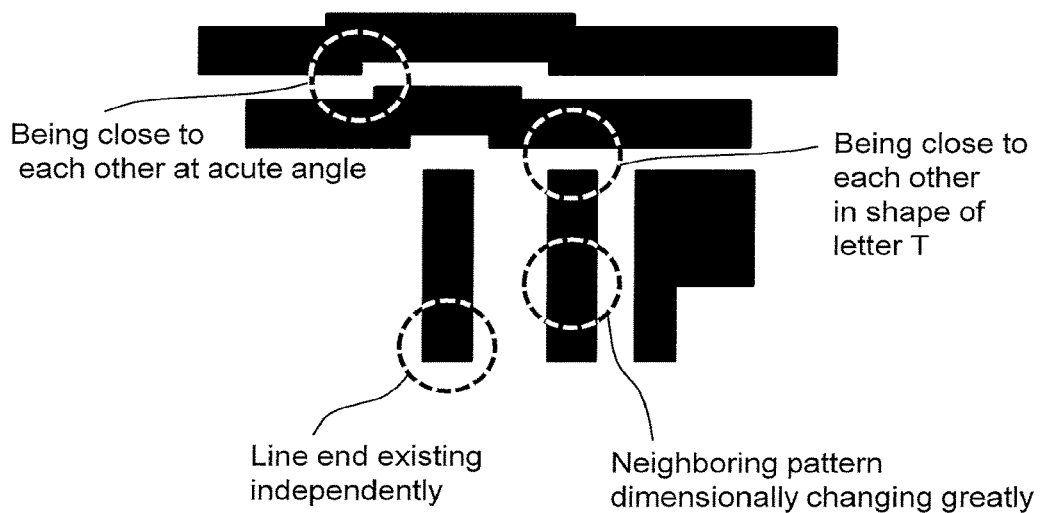
FIG. 9 shows an example of a feature which can be a critical point (hot spot) occurring in a wafer pattern described in the first embodiment.

FIG. 9 shows an example of a feature which can be a critical point (hot spot) occurring in a wafer pattern described in the first embodiment. As shown in FIG. 9, for example, the following features can be critical points (hot spots): a portion where adjacent wiring lines are close to each other at an acute angle, a portion where a wiring line extending in a certain direction and another wiring line extending perpendicularly to the wiring line are close to each other in the shape of a letter T, a portion where a wiring line end exists independently, and a portion where a neighboring pattern dimensionally changes greatly in the middle of a wiring line. Therefore, in the first embodiment, such features having possibility of becoming critical points (hot spots) are defined in advance.

Figure 10:
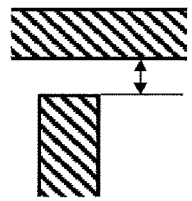
FIG. 10 shows an example of a feature description table according to the first embodiment.
Figure 10:
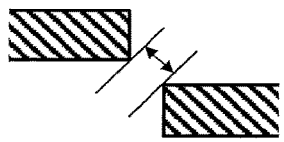

FIG. 10 shows an example of a feature description table according to the first embodiment. In the first embodiment, a table is generated which describes conditions to be defined as a feature point which has possibility of becoming a critical point (hot spot) in a wafer pattern. In the example of FIG. 10, with respect to a portion where a wiring line extending in a certain direction and another wiring line extending perpendicularly to the wiring line are close to each other in the shape of a letter T, if the distance between the wiring lines is less than a predetermined distance (nm), it is defined as a feature point. With respect to a portion where adjacent wiring lines are close to each other at an acute angle, if the distance between the acute angles is less than a predetermined distance (nm), it is defined as a feature point. Data of the feature description table is input into the inspection apparatus 100, and stored in the storage device 142.

In a critical point analyzing/specifying step, the critical point candidate analyzing/specifying circuit 112 (analysis unit) inputs layout data (design pattern data) of a circuit pattern layout (design pattern of a semiconductor device), and analyzes the layout data in order to specify the position of a pattern portion including the feature point which has been set in advance. Specifically, it operates as described below. Here, used is the circuit pattern layout (design pattern of a semiconductor element) to be formed on the wafer, which is the original design pattern of before performing clipping processing shown in FIG. 2. Layout data of the circuit pattern layout is input into the inspection apparatus 100, and stored in the storage device 109.

First, the layout analyzing circuit 113 reads the layout data of the circuit pattern layout from the storage device 109, and analyzes the shape of each pattern of the circuit pattern layout.

Next, the feature point specifying circuit 115 reads data of the feature description table from the storage device 142, and specifies a set of patterns which mutually satisfy feature conditions defined in the data of the feature description table from patterns for which analyzing the shape of the circuit pattern layout has been performed. The feature point of the mutually specified patterns becomes a critical point (hot spot) candidate.

Figure 11:
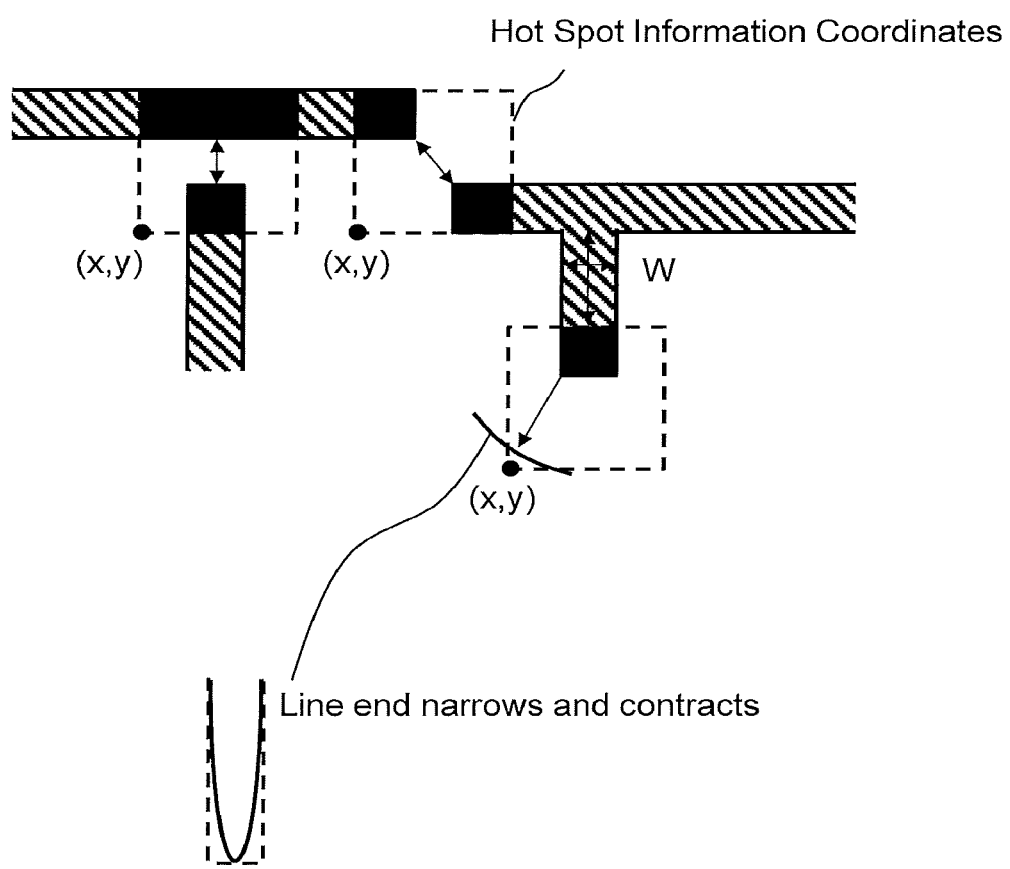
FIG. 11 illustrates a method for specifying a feature point according to the first embodiment.

FIG. 11 illustrates a method for specifying a feature point according to the first embodiment. FIG. 11 shows the case of specifying, for example, a portion where a wiring line extending in a certain direction and another wiring line extending perpendicularly to the wiring line are close to each other in the shape of a letter T, a portion where adjacent wiring lines are close to each other at an acute angle, and a portion where a wiring line end exists independently. The feature point specifying circuit 115 defines a quadrangle (rectangle, square, etc.) of a predetermined size including a feature point centering on the feature point of mutually specified patterns. For example, it defines by a 30 nm square. Then, the coordinates (x, y) of the reference point (e.g., lower left corner) of the square is defined as a region position (hot spot information coordinates) of a pattern portion including the feature point. Information on the region position of the pattern portion including the specified feature point is stored in the storage device 140.

According to the first embodiment, as described above, it is possible, in the inspection apparatus 100, to specify a portion including a feature point which has possibility of becoming a critical point in a wafer inspection, based on layout data (design pattern information) of the original circuit pattern layout in which no critical point has been specified. Therefore, it is not necessary purposely to get from others information on a region for which an inspection threshold value is to be changed.

Figure 12:
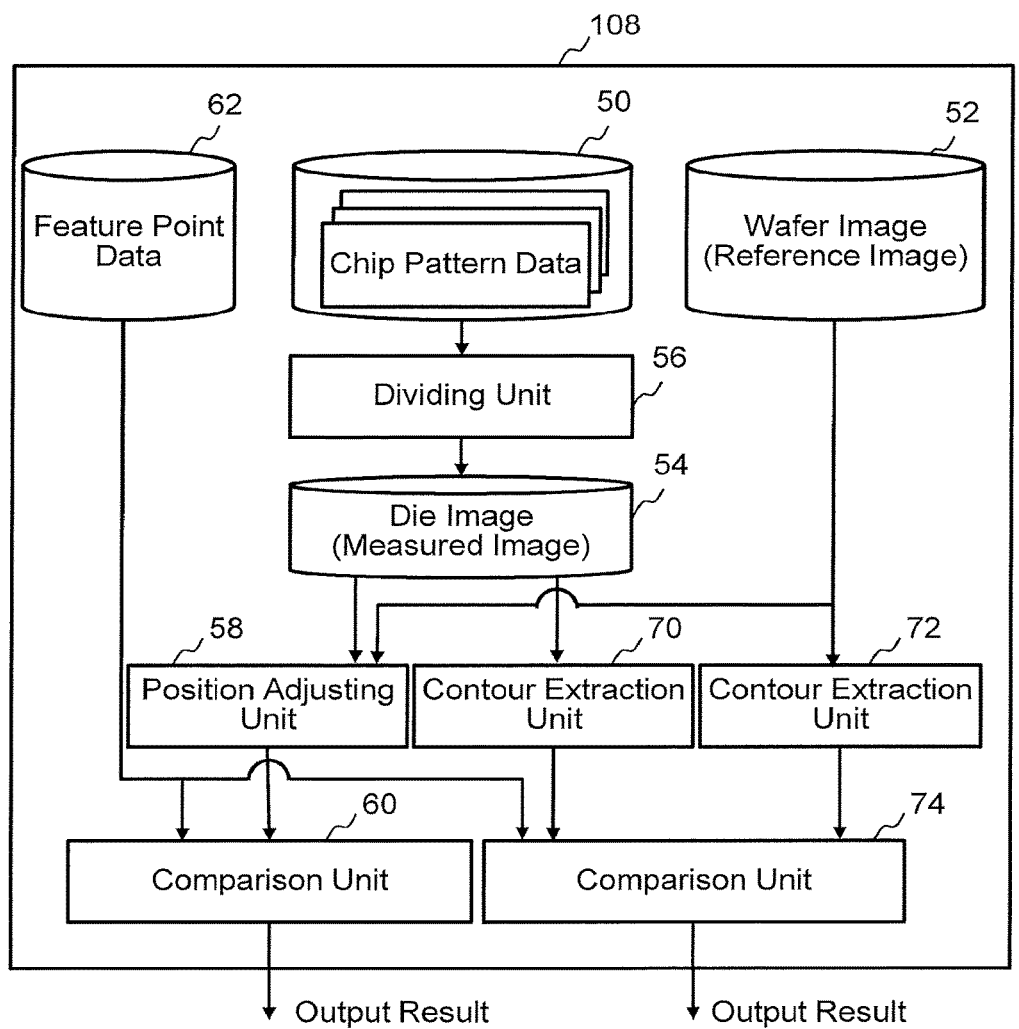
FIG. 12 shows an example of an internal block diagram showing a configuration of a comparison circuit according to the first embodiment.

FIG. 12 shows an example of an internal block diagram showing a configuration of a comparison circuit according to the first embodiment. As shown in FIG. 12, in the comparison circuit 108, there are arranged storage devices 50, 52, 54, and 62, such as magnetic disk drives, a dividing unit 56, a position adjusting unit 58, a comparison unit 60, contour extraction units 70 and 72, and a comparison unit 74. Each of the " . . . units" such as the dividing unit 56, the position adjusting unit 58, the comparison unit 60, the contour extraction units 70 and 72, and the comparison unit 74 includes a processing circuitry. As the processing circuitry, for example, an electric circuit, computer, processor, circuit board, quantum circuit, or semiconductor device may be used. Each of the " . . . units" may use a common processing circuitry (same processing circuitry), or different processing circuitries (separate processing circuitries). Input data necessary for the dividing unit 56, the position adjusting unit 58, the comparison unit 60, the contour extraction units 70 and 72, and the comparison unit 74, and operated (calculated) results are stored in a memory (not shown) each time.

First, the control computer 110 reads specified point data stored in the storage device 140, and outputs it to the comparison circuit 108. In the comparison circuit 108, the specified point data is stored in the storage device 62. Moreover, the control computer 110 reads a design wafer pattern image (SEM equivalent image) stored in the storage device 109, and outputs it to the comparison circuit 108. In the comparison circuit 108, the design wafer pattern image (SEM equivalent image) is stored in the storage device 52. Moreover, detected data (chip pattern data: secondary electron image) of each chip 332 is stored in the storage device 50.

In a dividing step, the dividing unit 56 divides chip pattern data into a plurality of mask die images by the size of the mask die 33 being a unit inspection region. Each mask die image is stored in the storage device 54.

As described above, using each acquired mask die image (secondary electron image) and a design wafer pattern image (SEM equivalent image: design substrate pattern image) of a region corresponding to each acquired mask die image, the comparison circuit 108 reads specified point data from the storage device 62, inputs position information on a specified position of a pattern portion including a feature point, and compares/determines a measured image (mask die image (secondary electron image)) of the mask die 33 and a design wafer pattern image of the region corresponding to the mask die image concerned while varying a determine threshold value by using the position information. Here, a gray image comparison inspection and a contour comparison inspection are performed in the comparison circuit 108. Now, the gray image comparison inspection will be described.

In a position adjustment step, the position adjusting unit 58 reads, for each mask die 33 used as a unit inspection region, measurement data composing a measured image (mask die image (secondary electron image)) of the mask die 33 concerned and image data of a corresponding reference image (design wafer pattern image: design substrate pattern image), and performs position adjustment of the measured image of the mask die 33 concerned and the corresponding reference image. It is preferable to perform position adjustment for each sub-pixel unit smaller than the measurement pixel 36 (or sub-irradiation region 29) being an inspection pixel. For example, the position adjustment is performed by a least-square method.

In a gray image comparison step, the comparison unit 60 (pixel comparison unit) performs a gray image comparison inspection for each pixel by comparing/determining a mask die image (secondary electron image) and a design wafer pattern image (design substrate pattern image).

Figure 13:
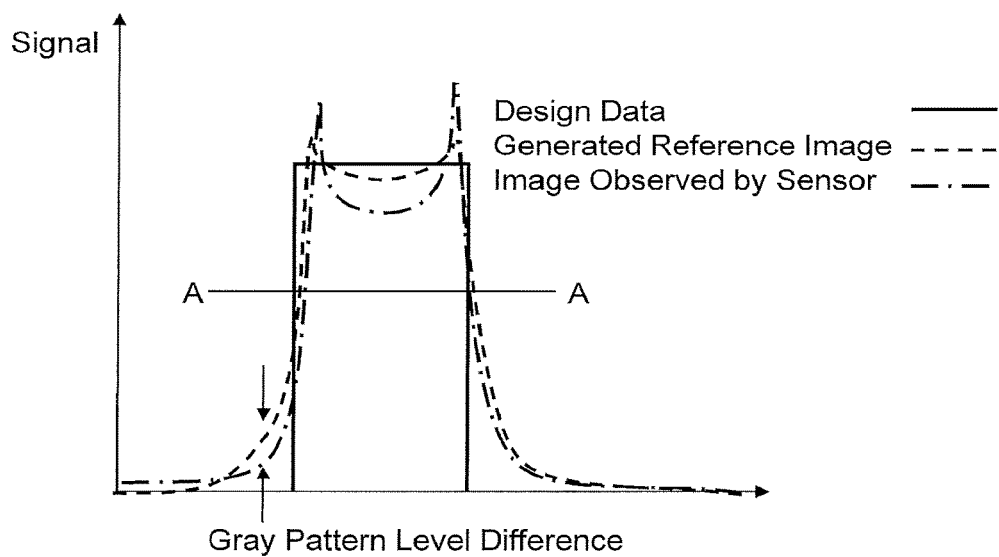
FIG. 13 illustrates gray image comparison inspection according to the first embodiment.

FIG. 13 illustrates gray image comparison inspection according to the first embodiment. In FIG. 13, the ordinate axis represents a pixel value (signal strength), and the abscissa axis represents a position. For example, when the pixel value (grayscale value) for each pixel 36 is plotted in the x direction, as shown in FIG. 13, the pixel value increases gradually from the pixel before the pattern end, and becomes still larger inside the pattern. Conversely, the pixel value decreases sequentially at the opposite end of the pattern. That is, one pattern end exists in the middle of the rise of the pixel value. The opposite end of the pattern exists in the middle of the fall of the pixel value. With respect to the inside of the quadrangular region having a reference point of coordinates defined in specified point data, the comparison unit 60 compares the mask die image (secondary electron image) and the design wafer pattern image (design substrate pattern image), using a strict determine threshold value $Th_1$ (first determine threshold value) and based on a predetermined determine condition, for each measurement pixel 36 (or sub-irradiation region 29) being an inspection pixel, in order to determine whether there is a defect such as a shape defect. For example, if a grayscale value difference (level difference) with respect to each measurement pixel 36 (or sub-irradiation region 29) used as an inspection pixel is larger than the strict determine threshold value $Th_1$ (first determine threshold value), it is determined that there is a defect. Then, the comparison result is output. It may be output to the storage device 109. Moreover, with respect to a region out of the quadrangular region having a reference point of coordinates defined in specified point data, the comparison unit 60 compares the mask die image (secondary electron image) and the design wafer pattern image (design substrate pattern image), using a loose determine threshold value $Th_1'$ (second determine threshold value) and based on a predetermined determine condition, for each measurement pixel 36 (or sub-irradiation region 29) being an inspection pixel, in order to determine whether there is a defect such as a shape defect. For example, if a grayscale value difference with respect to each measurement pixel 36 (or sub-irradiation region 29) used as an inspection pixel is larger than the loose determine threshold value $Th_1'$ (second determine threshold value), it is determined that there is a defect. For example, when pixel values are defined by 256 (0 to 255) grayscale levels, in determining the grayscale value difference, if the loose determine threshold value $Th_1'$ is set to 10 grayscale level, for example, the strict determine threshold value $Th_1$ (first determine threshold value) is set to 5 grayscale level, for example. Then, the comparison result is output. It may be output to the storage device 109, the monitor 117, or the memory 118, or output from the printer 119.

Next, the contour comparison inspection will be described.

In a contour extraction step, the contour extraction unit 70 reads a mask die image (secondary electron image) from the storage device 54, and extracts a contour of each pattern in an image. Similarly to the description for FIG. 13, one pattern end exists in the middle of the rise of the pixel value. The opposite end of the pattern exists in the middle of the fall of the pixel value. The contour should be extracted along this end portion. Similarly, the contour extraction unit 72 reads a corresponding design wafer pattern image (design substrate pattern image) from the storage device 52, and extracts a contour of each pattern in an image.

In a contour comparison step, the comparison unit 74 (contour comparison unit) performs a contour comparison inspection by determining based on a deviation obtained by comparison between the contour of a pattern in a mask die image (secondary electron image) and the contour of a pattern in a design wafer pattern image (design substrate pattern image).

Figure 14:
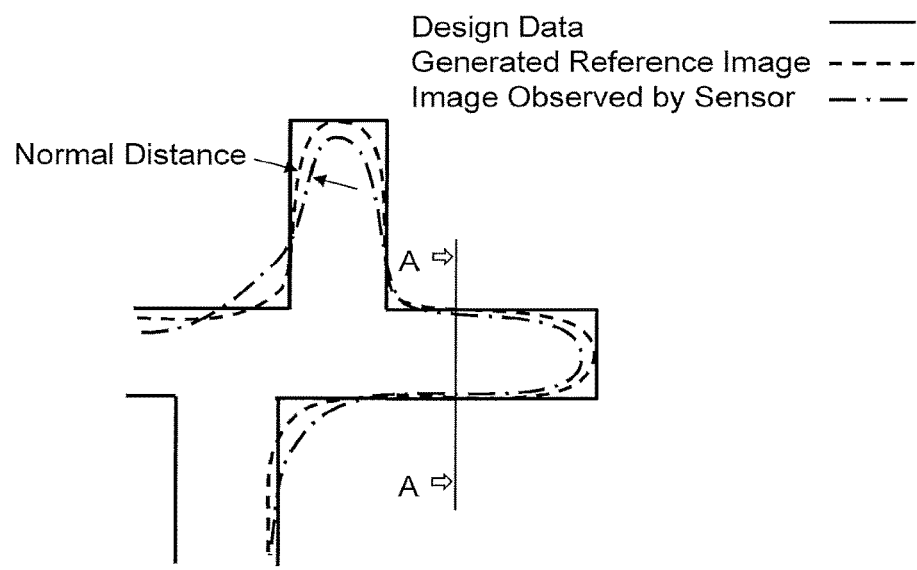
FIG. 14 illustrates a contour comparison inspection according to the first embodiment.

FIG. 14 illustrates a contour comparison inspection according to the first embodiment. FIG. 14 shows a top view of a partial pattern shown by contours. First, the comparison unit 74 performs matching, for each contour, between the contour of a mask die image (secondary electron image) and the contour of a design wafer pattern image (design substrate pattern image). Then, the comparison unit 74 measures, for each contour, a normal distance between a pair of contours for which matching has been performed. When measuring the normal distance, a point on the contour of the design wafer pattern image should be a reference point, for example. However, it is not limited thereto. It is also preferable that a point on the contour of the mask die image is a reference point. Then, with respect to the inside of the quadrangular region having a reference point of coordinates defined in specified point data, using a strict determine threshold value $Th_2$ (third determine threshold value), the comparison unit 74 compares, for each contour, a normal distance between the pair with the strict determine threshold value $Th_2$ to find whether there is a normal distance larger than the strict determine threshold value $Th_2$ (third determine threshold value). If such a normal distance exists, it is determined that there is a defect at the measurement point of the normal distance. The comparison result may be output to the storage device 109. Moreover, with respect to a region out of the quadrangular region having a reference point of coordinates defined in specified point data, using a loose determine threshold value $Th_2'$ (fourth determine threshold value), the comparison unit 74 compares, for each contour, a normal distance between the pair with the loose determine threshold value $Th_2'$ (fourth determine threshold value) to find whether there is a normal distance larger than the loose determine threshold value $Th_2'$. If such a normal distance exists, it is determined that there is a defect at the measurement point of the normal distance. Then, the comparison result may be output to the storage device 109, the monitor 117, or the memory 118, or output from the printer 119.

Although the contour comparison inspection is performed in all the regions in the examples described above, it is not limited thereto. For example, the contour comparison inspection may be carried out only in the quadrangular region having a reference point of coordinates defined in specified point data. Further, the contour comparison inspection may be carried out only for the contour corresponding to the point which has been determined to be defective by a gray image comparison inspection in the quadrangular region having a reference point of coordinates defined in specified point data. Alternatively, the contour comparison inspection may be performed, regardless of a region, only for the contour corresponding to the point which has been determined to be defective by a gray image comparison inspection.

As described above, according to the first embodiment, even if information on specified critical point has not been previously input, it is possible in the inspection apparatus 100 to inhibit detecting a subtle defect excessively (over precisely) in a region other than a portion including a feature point which has a possibility of becoming a critical point. Thus, it is possible in the inspection apparatus 100 to inhibit detecting a subtle defect excessively (over precisely) in a region other than a critical point.

In a storing step, regardless of a comparison result, the storage circuit 116 (storage unit) stores, for example, in the storage device 140, a mask die image (secondary electron image) and a design wafer pattern image (design substrate pattern image) at a position corresponding to specified point data (position information). Because an image of a critical point (hot spot) is forcibly stored, the stored data can be utilized as reference data in managing history in a subsequent inline inspection. Particularly, since the same mask pattern is transferred (printed) onto a plurality of places in the semiconductor substrate (wafer) by an exposure mask, it is preferable that mask die images (secondary electron image) at a plurality of places corresponding to specified point data (position information) and design wafer pattern images (design substrate pattern image) at the plurality of places are stored. By saving the image of the portion including a feature point which has possibility of becoming a critical point, difference between different chips 332 can be examined. Thereby, pattern change due to difference in production time can be examined in the same semiconductor substrate (wafer).

Furthermore, the same mask pattern is transferred (printed) onto a plurality of different semiconductor substrates (wafers) by the same exposure mask. Then, it is preferable for the storage circuit 116 (storage unit) to store, with respect to a plurality of different semiconductor substrates (wafers), a mask die image (secondary electron image) at a position corresponding to specified point data (position information) and a design wafer pattern image (design substrate pattern image) in the storage device 140, for example. Thereby, time-dependent pattern change due to the time passage greater than that of the case of the same semiconductor substrate (wafer) can be examined.

As described above, according to the first embodiment, it is possible to inhibit, in wafer inspection, false (pseudo) defects in regions other than a critical point, based on original design pattern information in which no critical point has been specified. Moreover, inspection can be performed using a strict determine threshold value in the region where a critical point exists. Therefore, it becomes possible to efficiently check and determine, for example, whether the shape of an assistant pattern such as an OPC added for mask writing is suitable or not. For example, when detecting a defect which is common to a plurality of dies on a wafer, it can be determined that the defect is caused from the mask.

In the above description, each " . . . circuit" includes a processing circuitry. As the processing circuitry, for example, an electric circuit, computer, processor, circuit board, quantum circuit, semiconductor device, or the like can be used. Each "... circuit" may use a common processing circuitry (same processing circuitry), or different processing circuitries (separate processing circuitries). A program for causing a processor to execute processing may be stored in a recording medium, such as a magnetic disk drive, magnetic tape drive, FD, ROM (Read Only Memory), etc. For example, the position circuit 107, the comparison circuit 108, the layout analyzing circuit 113, the feature point specifying circuit 115, and the like may be configured by at least one of the processing circuitries described above.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed.

In addition, any other pattern inspection method and pattern inspection apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam inspection apparatus comprising:
    a storage device configured to store a design substrate pattern image generated assuming a design substrate pattern which is one among a design pattern of a semiconductor element, a design mask pattern formed on an exposure mask used for transferring the design pattern of the semiconductor element onto a semiconductor substrate, and the design substrate pattern formed on the semiconductor substrate in a case of the design mask pattern having been transferred onto the semiconductor substrate;
    a secondary electron image acquisition mechanism having an electron beam column and a detector, configured to acquire a secondary electron image by making the detector detect secondary electrons generated by making the electron beam column irradiate the semiconductor substrate with an electron beam;
    an analyzing circuit configured to input design pattern data of the design pattern of the semiconductor element, and specify a position of a pattern portion including a feature point, which has been set in advance, by analyzing the design pattern data; and
    a comparison circuit configured to input position information defining a specified position of the pattern portion including the feature point, and determine whether there is a defect by comparing the secondary electron image and the design substrate pattern image of a region corresponding to the secondary electron image using a determination threshold value while varying the determination threshold value for the pattern portion including the feature point by using the specified position defined by the position information.

2. The apparatus according to claim 1, wherein the comparison circuit includes
    a pixel comparison circuit which compares between the secondary electron image and the design substrate pattern image for each pixel, and
    a contour comparison circuit which determines based on a deviation obtained by comparison between a contour of a pattern in the secondary electron image and a contour of a pattern in the design substrate pattern image.

3. The apparatus according to claim 1, further comprising:
    a storage circuit configured to store, regardless of a result of the comparing, the secondary electron image and the design substrate pattern image at a position corresponding to the position information.

4. The apparatus according to claim 3, wherein
    a same mask pattern is transferred onto a plurality of places in the semiconductor substrate by the exposure mask, and
    the secondary electron image and the design substrate pattern image at the position corresponding to the position information is stored at each of the plurality of places.

5. The apparatus according to claim 1, wherein the secondary electron image acquisition mechanism acquires a multi-secondary electron image by multi-secondary electrons generated by irradiating the semiconductor substrate with multi-beams as the electron beam.

6. The apparatus according to claim 1, further comprising:
a storage device configured to store feature description data describing the feature point.

7. The apparatus according to claim 6, wherein the analyzing circuit reads the feature description data, and specifies the position of the pattern portion, based on the feature point described in the feature description data.

8. The apparatus according to claim 1, wherein the secondary electron image acquisition mechanism acquires, as the secondary electron image, an image of a small region smaller than each of a plurality of wafer dies formed on the semiconductor substrate.

9. The apparatus according to claim 2, wherein the contour comparison circuit determines whether there is a true defect based on a deviation obtained b comparison between the secondary electron image, which has been determined to be defective by the pixel comparison circuit, and the contour of the pattern.

10. An electron beam inspection method comprising:
    storing a design substrate pattern image generated assuming a design substrate pattern which is one among a design pattern of a semiconductor element, a design mask pattern formed on an exposure mask used for transferring the design pattern of the semiconductor element onto a semiconductor substrate, and the design substrate pattern formed on the semiconductor substrate in a case of the design mask pattern having been transferred onto the semiconductor substrate;
    acquiring a secondary electron image by secondary electrons including a reflected electron generated by irradiating the semiconductor substrate with an electron beam;
    inputting design pattern data of the design pattern of the semiconductor element, and specifying a position of a pattern portion including a feature point, which has been set in advance, by analyzing the design pattern data; and
    inputting position information defining a specified position of the pattern portion including the feature point, and determining whether there is a defect by comparing the secondary electron image and the design substrate pattern image of a region corresponding to the secondary electron image using a determination threshold value while varying the determination threshold value for the pattern portion including the feature point by using the specified position defined by the position information.

\* \* \* \* \*